(12) United States Patent
Mimotogi et al.

(10) Patent No.: US 8,230,369 B2
(45) Date of Patent: Jul. 24, 2012

(54) SIMULATION METHOD AND SIMULATION PROGRAM

(75) Inventors: Akiko Mimotogi, Yokohama (JP); Satoshi Tanaka, Kawasaki (JP); Shoji Mimotogi, Yokohama (JP); Takashi Sato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 506 days.

(21) Appl. No.: 12/395,481

(22) Filed: Feb. 27, 2009

(65) Prior Publication Data
US 2009/0217233 A1    Aug. 27, 2009

(30) Foreign Application Priority Data

Feb. 27, 2008  (JP) ................................ 2008-046179
Apr. 9, 2008   (JP) ................................ 2008-101730

(51) Int. Cl.
*G06F 17/50*    (2006.01)
(52) U.S. Cl. ......................................................... 716/55
(58) Field of Classification Search .................... 716/53, 716/55, 104
See application file for complete search history.

(56) References Cited

U.S. PATENT DOCUMENTS 7,171,034 B2 *   1/2007  Wu et al. ........................ 382/144
2007/0234269 A1  10/2007 Tanaka et al.

FOREIGN PATENT DOCUMENTS

| JP | 07-037769 | 2/1995 |
|---|---|---|
| JP | 2002-184688 | 6/2002 |
| JP | 2003-257810 | 9/2003 |
| JP | 2005-128558 | 5/2005 |
| JP | 2005-340493 | 12/2005 |
| JP | 2006-196555 | 7/2006 |
| JP | 2006-237184 | 9/2006 |
| JP | 2006-259699 | 9/2006 |
| JP | 2006-276260 | 10/2006 |
| JP | 2006-332168 | 12/2006 |
| JP | 2007-165894 | 6/2007 |
| JP | 2007-273560 | 10/2007 |
| JP | 2008-026627 | 2/2008 |
| JP | 2008-209663 | 9/2008 |

(Continued)

OTHER PUBLICATIONS

Decision of Rejection mailed by Japanese Patent Office on Nov. 9, 2010, in Japanese patent application No. 2008-046179.

(Continued)

*Primary Examiner* — Thuan Do
(74) *Attorney, Agent, or Firm* — Finnegan, Henderson, Farabow, Garrett & Dunner, L.L.P.

(57) ABSTRACT

A method of simulating an optical intensity distribution on a substrate when a mask pattern formed on the mask is transferred to the substrate through a projection optical system by irradiating an illumination light obliquely on a mask surface of the mask, which comprises setting a phase difference between a zero-order diffraction light and a first-order diffraction light determined according to at least one of a distance between the zero-order diffraction light and the first-order diffraction light on a pupil of the projection optical system, thickness of a light-shielding portion formed on the mask, angle defined by an optical axis direction of the illumination light and an incident direction on the mask, and a difference between a size of the mask pattern and a half cycle of the mask pattern, and carrying out a simulation of the optical intensity distribution on the substrate according to the set phase difference.

9 Claims, 9 Drawing Sheets

FOREIGN PATENT DOCUMENTS

WO     WO 2008/010548 A1     1/2008

OTHER PUBLICATIONS

Notice of Reasons for Rejection issued by Japanese Patent Office of Jun. 1, 2010, in Japanese patent application No. 2008-046179 and English translation thereof.

Otaki, "Asymmetric Properties of the Aerial Image in Extreme Ultraviolet Lithography," *Jpn. J. Appl. Phys.* 39:6819-6826 (2000).

First Office Action mailed Mar. 27, 2012, from the Japanese Patent Office for counterpart Japanese Patent Application No. 2008-101730 (4 pages).

\* cited by examiner

Area ratio=0.8

F I G. 1 5 A

Area ratio=1

F I G. 1 5 B

Area ratio=1.2

F I G. 1 5 C

SIMULATION METHOD AND SIMULATION PROGRAM

CROSS-REFERENCE TO RELATED APPLICATIONS

This application is based upon and claims the benefit of priority from prior Japanese Patent Applications No. 2008-046179, filed Feb. 27, 2008; and No. 2008-101730, filed Apr. 9, 2008, the entire contents of both of which are incorporated herein by reference.

BACKGROUND OF THE INVENTION

1. Field of the Invention

The invention relates to a lithography simulation technique used for manufacturing a semiconductor device, and more particularly to a simulation method for simulating light intensity on a substrate in a lithography process. Further, it relates to a program for carrying out the simulation method in a computer.

2. Description of the Related Art

In a lithography process using an immersion lithography device of high NA (numerical aperture) and an ArF light as an exposure light for manufacturing a semiconductor device of a 45 nm node, the pattern size on a mask is almost the same as the wavelength of the ArF light. In this case, a waveguide effect caused by mask topography and a shadowing effect caused by oblique incident light are not negligible.

In the lithography simulation for designing an LSI, the thickness of a mask and incident angle of an exposure light beam to the mask must be taken into careful consideration when simulating an intensity distribution of the irradiated light on the substrate surface through the mask. Namely, a strict calculation for obtaining a solution of Maxwell's equation is essential, considering the three-dimensional structure of the mask. This calculation, however, takes 10 to 100 times longer than the thin mask approximate calculation in a simulation that does not consider the thickness of a mask. In the actual development, design speed is an important factor and this increase in the calculation time becomes a serious problem.

For the purpose of avoiding the problem, a method (for example, Jpn. Pat. Appln. KOKAI Publication No. 2007-273560) has been proposed in which a three-dimensional mask pattern is redefined as a flat type mask pattern (thin mask pattern), taking into consideration geometrically the size of a light-shielding portion (including a semitransparent portion) and the size of a transparent portion when the three-dimensional mask pattern is irradiated with the exposure light by a light source, hence to obtain an optical image substantially equal to that obtained through a strict calculation taking the incident angle of the exposure light into consideration, in a short time. In this method, however, a phase difference of the light-shielding portion in the thin mask approximate calculation is constant regardless of the incident angle of the exposure light and therefore there is a fear that the accuracy of detecting out-of-focus is low.

As mentioned above, according to the light intensity distribution simulation method of measuring the intensity distribution of the irradiated light on a substrate surface through a mask, accurate measurement is possible but an enormous calculation time is necessary when carrying out the solution calculation of the Maxwell's equation taking the three-dimensional mask structure into consideration. On the other hand, when carrying out the thin mask approximate calculation with the three-dimensional mask pattern redefined as the flat type mask pattern as shown in Jpn. Pat. Appln. KOKAI Publication No. 2007-273560, it is possible to reduce the calculation time but an accurate measurement is not possible due to the adverse influence of the light-shielding portion.

BRIEF SUMMARY OF THE INVENTION

According to a first aspect of the present invention, there is provided a method of simulating an optical intensity distribution on a substrate when a mask pattern formed on the mask is transferred to the substrate through a projection optical system by irradiating an illumination light obliquely on a mask surface of the mask, comprising:

setting a phase difference between a zero-order diffraction light and a first-order diffraction light determined according to at least one of a distance between the zero-order diffraction light and the first-order diffraction light on a pupil of the projection optical system, thickness of a light-shielding portion formed on the mask, angle defined by an optical axis direction of the illumination light and an incident direction on the mask, and a difference between a size of the mask pattern and a half cycle of the mask pattern when the mask pattern is a periodic pattern; and carrying out a simulation of the optical intensity distribution on the substrate according to the set phase difference.

According to a second aspect of the present invention, there is provided a program readable and executable by a computer, for simulating an optical intensity distribution on a substrate when a mask pattern formed on the mask is transferred onto the substrate through a projection optical system by irradiating an illumination light obliquely on a mask surface of the mask, comprising:

a procedure of setting a phase difference between a zero-order diffraction light and a first-order diffraction light determined according to at least one of a distance between the zero-order diffraction light and the first-order diffraction light on a pupil of the projection optical system, thickness of a light-shielding portion formed on the mask, angle defined by an optical axis direction of the illumination light and an incident direction on the mask, and a difference between a size of the mask pattern and a half cycle size of the mask pattern when the mask pattern is a periodic pattern; and a procedure of carrying out a simulation of the optical intensity distribution on the substrate according to the set phase difference.

According to a third aspect of the present invention, there is provided a method of simulating an optical intensity distribution in a transfer process for transferring a mask pattern formed on a mask onto a substrate through a projection optical system by irradiating an illumination light obliquely on a mask surface of a three-dimensional mask, assuming that the three-dimensional mask is a thin mask, comprising:

obtaining in advance a shift amount of a phase difference and an amplitude ratio between a zero-order diffraction light and a first-order diffraction light on a pupil of the projection optical system, respectively in the transfer process using the thin mask having a predetermined area ratio of an aperture in a predetermined mask region and in the transfer process using the three-dimensional mask having the same area ratio as the thin mask;

calculating the phase difference and the amplitude ratio between the zero-order diffraction light and the first-order diffraction light on the pupil of the projection optical system in the transfer process using a thin mask having an arbitrary area ratio; and carrying out a simulation in the transfer process using the thin mask having the arbitrary area ratio, based on the phase difference and the amplitude ratio set by adding the shift amount to the calculated phase difference and amplitude ratio.

DETAILED DESCRIPTION OF THE INVENTION

Hereinafter, embodiments of the invention will be described referring to the drawings.

Figure 1:
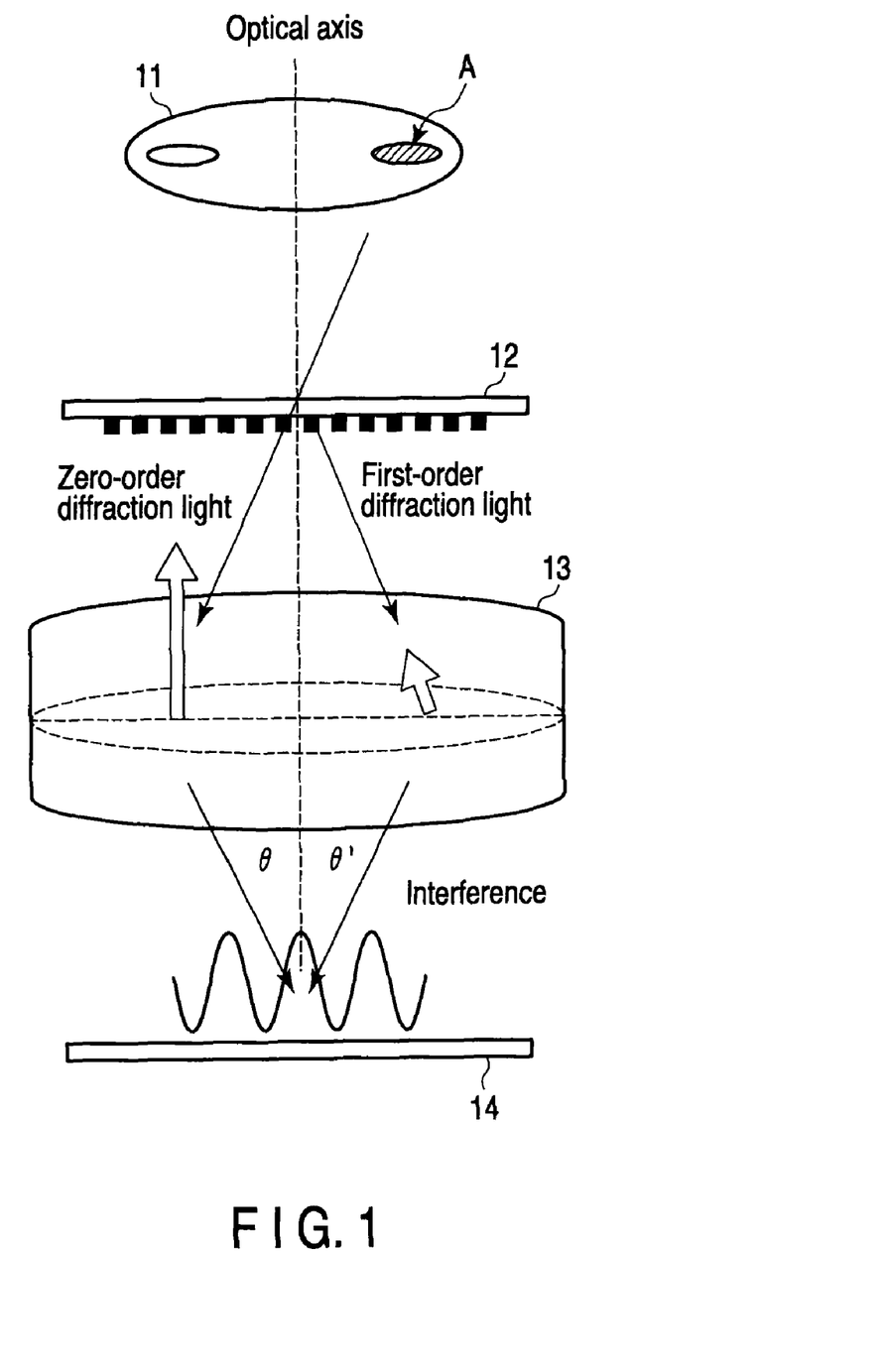
FIG. 1 is a view schematically showing an example of a structure of a projection aligner used in embodiments of the present invention.

FIG. 1 is a view schematically showing an example of structure of a projection aligner used in embodiments of the present invention, and a reference numeral 11 shows a light source, a reference numeral 12 shows a mask, a reference numeral 13 shows a projection optical system, and a reference numeral 14 shows a substrate (wafer). The example shows an oblique illumination method using dipole illumination 11. The light from a point light source A of the light source 11 is incident on the mask surface at a slant, and a zero-order diffraction light and a first-order diffraction light from the mask 12 are converged by the projection optical system 13 to form an image on the substrate 14. Here, the zero-order diffraction light and the first-order diffraction light on the pupil of the projection optical system 13 are positioned apart by a distance of a pattern pitch on the mask and the distance x is expressed as:

$$x = \lambda/(2 \cdot HP)$$

where the half of the pattern pitch is defined as HP and the wavelength of exposure light is defined as $\lambda$.

The light intensity distribution on the substrate 14 in the case of using this projection aligner is required through a simulation and the pattern of the mask 12 is corrected according to the simulation result, thereby forming a desired pattern on the substrate 14.

As mentioned above, an accurate measurement is possible but it takes an enormous amount of time in the strict calculation considering the three-dimensional mask structure. Then, redefinition as a thin mask by a shadow model is considered, as shown in Jpn. Pat. Appln. KOKAI Publication No. 2007-273560.

Figure 2A:
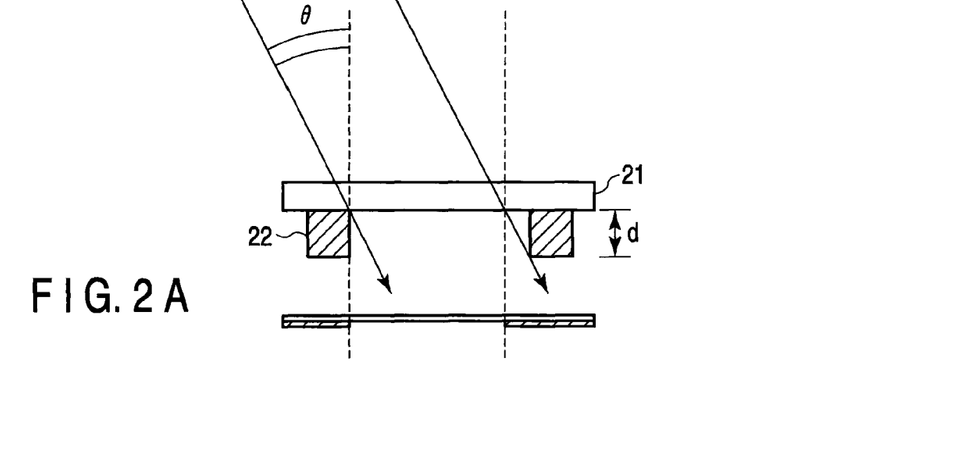
FIG. 2A is a cross-sectional view of an example of a mask obtained by redefining a three-dimensional mask as a flat type mask (thin mask), in which only a shadowing effect due to oblique incidence is taken into consideration.
Figure 2B:
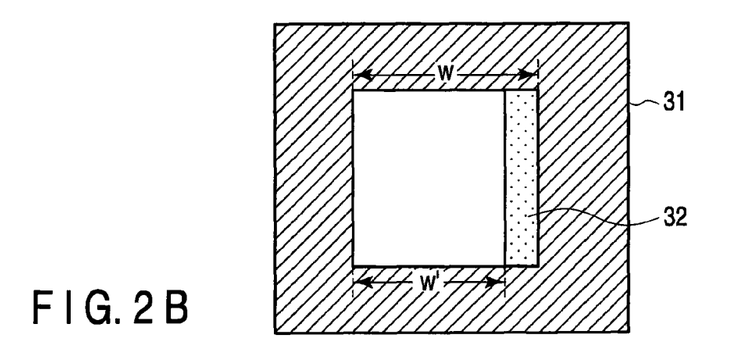
FIG. 2B is a plan view of the mask shown in FIG. 2A resulting from the redefinition as the flat type mask.

At first, as shown in FIG. 2, the mask (three-dimensional mask) 21 having three dimensions is redefined as a flat type mask (thin mask) 31, taking only the shadowing effect due to oblique incidence into consideration. A reference symbol $\theta$ shows the incident angle (an angle between an optical axis of the irradiated light and an incident direction of the exposure light on the mask) of the exposure light and a reference symbol d shows the thickness of the light-shielding portion (including a semitransparent portion) 22.

For example, in order to resolve a contact hole pattern having a one-to-one ratio of the pattern width and the pattern space width and a pitch 100 nm, when an illumination condition is defined in such a scheme that NA=1.3, quadrupole illumination is used as a light source, the distance $\sigma_{center}$ from the optical axis to each center of the quadrupole illumination is defined as $\sigma_{center}$=0.8, and a reduction rate Mag of an exposure device is defined as Mag=4, the incidence angle $\theta$ of the exposure light on the mask from each point light source at the center of the quadrupole illumination is determined as follows:

$$\sin\theta = NA \times \sigma_{center}/Mag = 0.26$$

$$\therefore \theta = 15.07 \text{ deg}$$

For simplification, it is assumed that the exposure light cannot pass through a shadow portion (fringe of the aperture) 32 against the light irradiated in the slanting direction at the incident angle $\theta$ from the optical axis, in other words, that the exposure light is shielded.

When the size w of the aperture (mask pattern) of the three-dimensional mask 21, that is, the mask before the redefinition is defined as 70 nm, since tan $\theta$=0.269260, the size w' of the aperture (mask pattern) of the thin mask 31, that is, the mask after the redefinition becomes:

$$w' = w - d \cdot \tan\theta = 65.29 \text{ nm}$$

Figure 3:
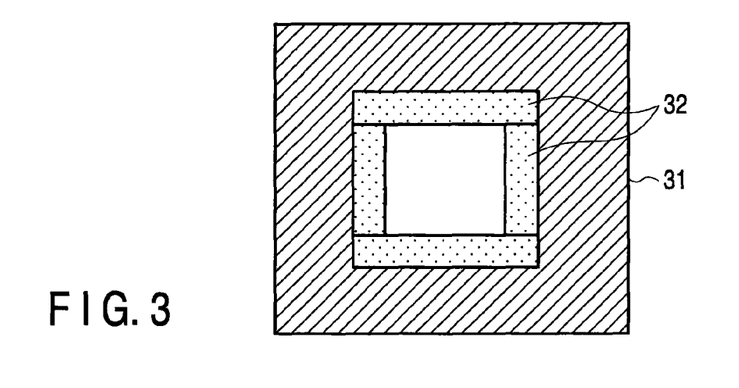
FIG. 3 is a plan view of the mask shown in FIG. 2A, for use in describing a method of calculating an optical intensity distribution with a certain amount of transmittance and phase given to a shadow part (fringe) around an aperture.

Here, as shown in FIG. 3, a calculation method with a constant transmittance and phase given to the shadow portion (fringe) 32 is proposed in order to take a phase difference in the shadow portion 32 into consideration. This calculation, however, determines a phase distribution of a diffraction light passing through the fringe 32 uniquely.

Figure 4:
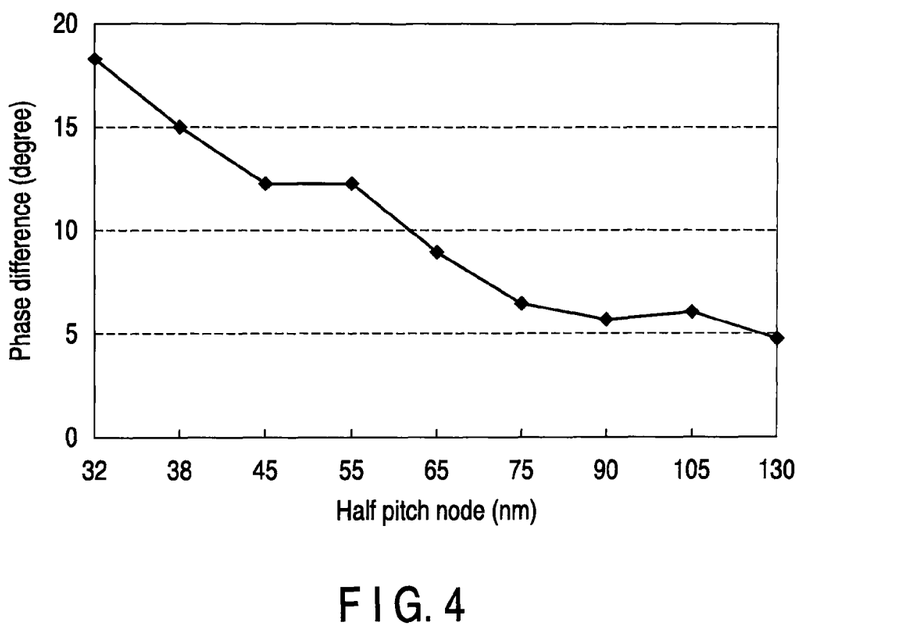
FIG. 4 is a view showing HP (half pitch) dependence of a phase difference between a zero-order diffraction light and a first-order diffraction light of an L/S (line/space) pattern having a one-to-one ratio of a pattern width and a pattern space.

FIG. 4 shows a half pitch (HP) dependence of the phase difference between a zero-order diffraction light and a first-order diffraction light of a periodic pattern of a one-to-one ratio of the pattern width and the pattern space width. FIG. 4 shows that the phase difference between the zero-order diffraction light and the first-order diffraction light is getting smaller according to an increase in the half pitch HP.

The phase difference of the diffraction lights largely affects the simulation accuracy. Therefore, the conventional calculation method with a constant transmittance and phase given to the shadow portion 32 cannot provide an accurate simulation, thus it is necessary to take into consideration the effect of the phase difference distribution between the diffraction lights in order to properly carry out a high accuracy simulation. In consideration of this, the phase in the fringe is not fixed but the phase difference distribution between the diffraction lights corresponding to various parameters should be taken into account.

Figure 5:
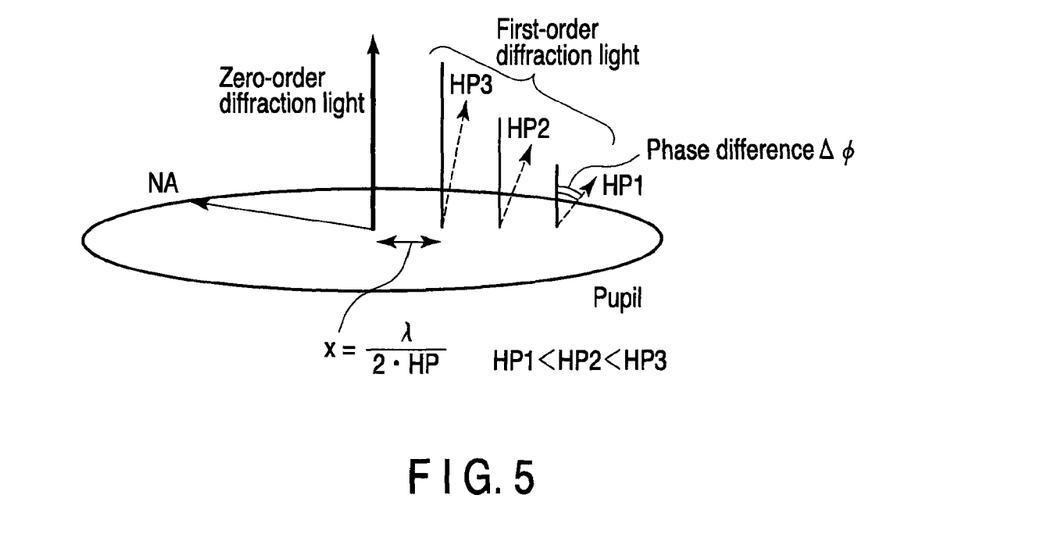
FIG. 5 is a view showing a phase difference $\Delta\phi$ between the zero-order diffraction light and the first-order diffraction light in a pupil surface of a projection lens.

FIG. 5 is a view schematically showing the zero-order diffraction light and the first-order diffraction light on the pupil of the projection optical system. Each arrow in FIG. 5 shows a diffraction light beam. The size of each arrow shows the amplitude of each diffraction light beam, and the angle formed by each of the arrows showing each diffraction light beam with the light source direction of the optical axis as positive shows a phase. Three first-order diffraction light beams show that they appear at different positions when the light beams having different half pitches; HP1, HP2, and HP3 in FIG. 5 are irradiated from the point light source on the optical axis. Here, the relationship between the respective HPs is HP1<HP2<HP3. From FIG. 4, it is found that the phase difference between the zero-order diffraction light beam and the first-order diffraction light beam gets larger as the HP becomes smaller. Further, the distances x1, x2, and x3 between the zero-order diffraction light and the first-order diffraction light corresponding to the respective patterns having HP1, HP2, and HP3 are x1>x2>x3 according to the formula:

$$x=\lambda/(2 \cdot HP)$$

Therefore, the phase difference $\Delta\phi$ is given with the space x between the zero-order diffraction light and the first-order diffraction light on the pupil as a variable.

Figure 6:
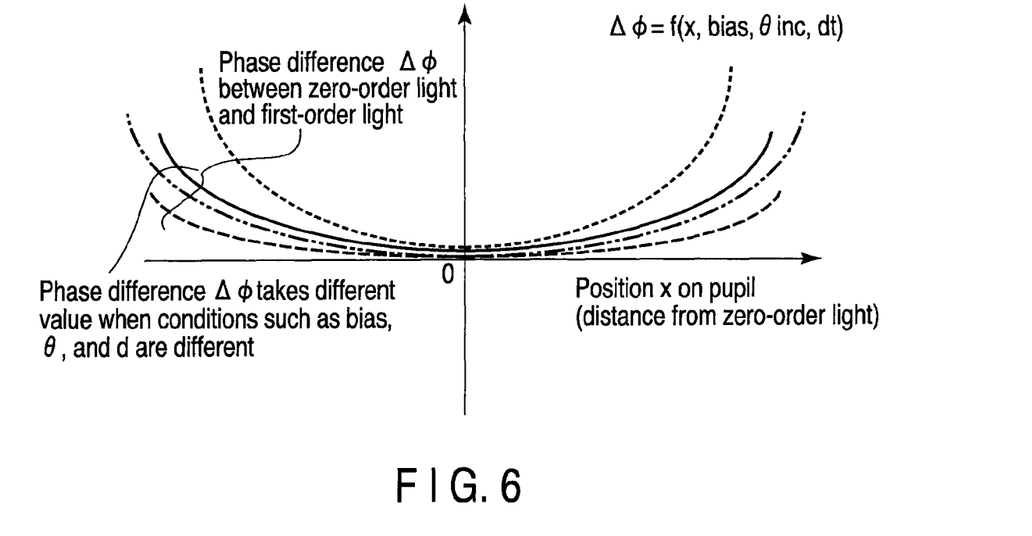
FIG. 6 is a characteristic curve showing a phase difference $\Delta\phi$ between the zero-order diffraction light and the first-order diffraction light at the pupil position of the projection lens.

FIG. 6 is a view showing the phase difference $\Delta\phi$ between the zero-order diffraction light and the first-order diffraction light on the pupil. The phase difference $\Delta\phi$ is expressed as:

$$\Delta\phi=f(x, bias, \theta, d)$$

x: distance between zero-order diffraction light and first-order diffraction light on the pupil,
bias: amount of difference between pattern size and HP of periodic mask pattern
$\theta$: incident angle of exposure light
d: film thickness of light-shielding portion of mask.

Since the phase difference takes a different value according to a difference in the condition determined by the bias, $\theta$, and d, the characteristic curve of the phase difference varies depending on the condition. It takes a large amount of time to calculate the phase difference that differs according to the condition, and the calculation in the simulation mode deteriorates the simulation speed.

In this point of view, according to an embodiment of the present invention, the phase differences under various lithography conditions are calculated in advance and the calculation results are stored in a DB (data base) or functionalized, in order to inhibit a drop in speed. As the calculation result, an absolute value of the phase difference may be used, or a phase difference between the phase obtained by the calculation (strict calculation) in the case of taking the three-dimensional mask structure into consideration and the phase obtained by the calculation (thin mask approximate calculation) in the case of redefining the three-dimensional mask as a thin mask may be used. The necessary phase difference is taken out from the DB in the simulation mode. Alternatively, the phase difference is calculated based on the function.

It is not necessary to perform a strict calculation for all the conditions, under any condition. When the condition at the time of the calculation corresponds to the medium condition between the two approximate conditions which have been already stored in the DB, the phase difference may be obtained through interpolation between the two approximate conditions. Alternatively, a function model may be created from the conditions having been already stored in the DB, to calculate a phase difference based on the function model.

In the simulation, the phase of a diffraction light beam obtained via the thin mask approximate calculation is entered in the following methods:

(i) The phase of the diffraction light beam obtained via the thin mask approximate calculation is entered in the simulation as an aberration.

(ii) The phase of the diffraction light beam obtained via the thin mask approximate calculation is directly entered into a phase item of the diffraction light. Namely, the result (corresponding to the distribution on the pupil) from the Fourier-transform processing at the time of the thin mask approximate calculation is replaced with the phase of the diffraction light through the thin mask approximate calculation.

In this manner, the calculation with the three-dimensional mask structure taken into consideration is enabled at the same speed as that of the thin mask approximate calculation.

An embodiment in the case where the present invention is applied to the design of a lithography process in the fabrication of a semiconductor device will be hereinafter described.

Figure 7:
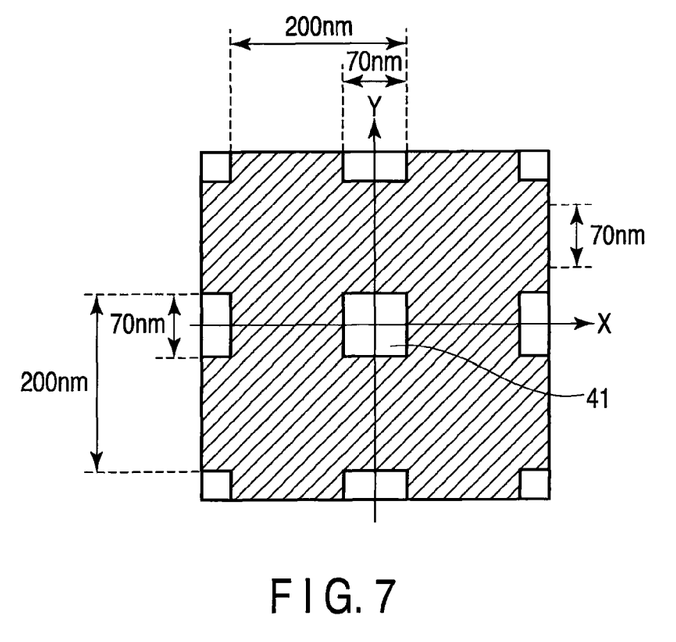
FIG. 7 is a view showing a substrate at a time when a contact hole pattern is defined as a target pattern in an embodiment of the present invention.

In the design of a lithography process in the fabrication of a semiconductor device, an example will be described about the size design of a contact hole pattern on a mask corresponding to a contact hole pattern 41 as shown in FIG. 7 so that the contact hole pattern 41 can be transferred onto the substrate with a light-sensitive film deposited thereon within the desired size range.

Figure 8:
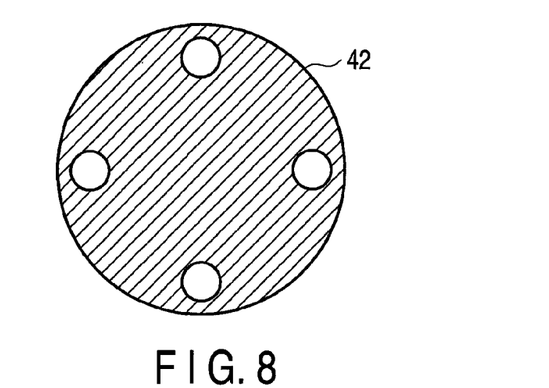
FIG. 8 is a view showing a quadrupole illumination used in the embodiment.

The device having the structure shown in FIG. 1 is used as the exposure device. Quadrupole 42 capable of four-eyed illumination is used as the light source, as shown in FIG. 8. Further, NA=1.3, the distance from the optical axis to the center of each eye is defined as $\sigma_{center}$=0.85, the size of each eye is defined as $\sigma_{radius}$=0.05, and the mask magnification Mag of the projection aligner is defined as 4.

Figure 9:
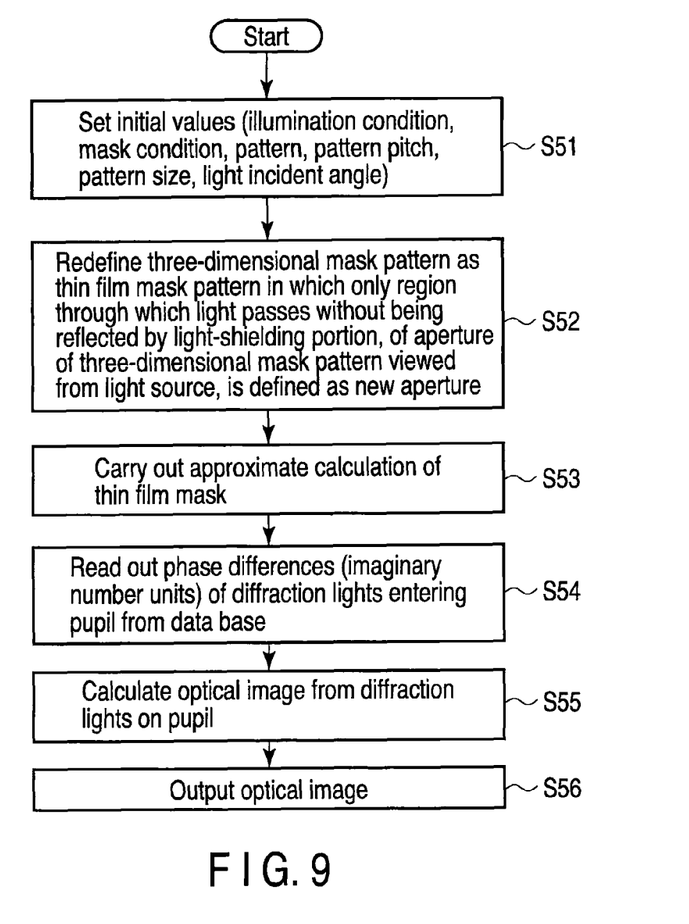
FIG. 9 is a flow chart for use in describing an operation of an optical image calculation unit in the embodiment.

The pitch of the contact hole 41 is defined as 200 nm and the aperture size is defined as 70 nm. This size is a converted value corresponding to the size of the contact hole formed on the substrate. FIG. 9 shows a flow chart for use in describing the operation of an optical image calculation unit in the embodiment.

At first, an illumination condition, a mask condition, a pattern type, a pattern pitch, a pattern size, and a light incident angle as mentioned above are set as initial values (Step S51).

Next, an optical image calculation is performed to examine a transfer characteristic when an ArF immersion exposure device is used to form an image of a contact hole having the ratio 1:3 (the ratio between the contact hole pattern width and the contact hole pattern space width) provided on a three-dimensional attenuated phase shift mask, onto the substrate with the light-sensitive film deposited thereon.

Namely, the light incident angle θ on the mask from the two light sources arranged in the x direction of FIG. 7, of the quadrupole shown in FIG. 8 is as follows:

$$\sin\theta = NA \times \sigma_{center}/Mag$$

$$\therefore \theta = 16.04 \text{ deg}$$

Therefore, of the aperture area having a size w=70 nm into which the incident light comes, an area where the incident light is not reflected by the light-shielding portion is as follows:

$$w' = w - d \cdot \tan\theta = 65.0 \text{ nm}$$

The aperture of 65.0 nm×70 nm is regarded as the redefined aperture for the illumination light from the two light sources and the three-dimensional attenuated phase shift mask is redefined as the flat type mask (thin mask) (Step S52), taking into consideration the barycentric deviation of the pattern assumed from the expected light incident angle, and the diffraction light distribution on the pupil is obtained through the thin mask approximate calculation (Step S53). At this time, although the phase of the diffraction light beam actually has an oblique incident angle dependence, the calculation is performed as the flat type mask and therefore the phase of the diffraction light beam becomes constant regardless of the oblique incident angle.

A phase difference (an imaginary number unit) between the zero-order diffraction light and the first-order diffraction light on the pupil which has been obtained through strict calculation using a three-dimensional mask and stored in the DB (data base) in advance is read out from the DB (Step S54). The phase difference read out from the DB has been previously obtained through strict calculation with a three-dimensional mask under a necessary condition and stored in the DB with the pattern type, pattern pitch, pattern bias, and incident angle of the exposure light as parameters. The phase of the first-order diffraction light is newly calculated based on the phase difference read out from the DB and the phase of the zero-order diffraction light on the pupil obtained through the thin mask approximate calculation, and the newly calculated phase is replaced with the phase of the first-order diffraction light obtained through the thin mask approximate calculation (Step S55). Next, the zero-order diffraction light on the pupil obtained through the thin mask approximate calculation and the first-order diffraction light replaced with the phase of the first-order diffraction light obtained through the thin mask approximate calculation are reverse-Fourier transformed and output as a simulation result of the optical intensity distribution on the light-sensitive film on the substrate (Step S56). Since the quadrupole illumination is used in the embodiment, the optical intensity distribution of the two light sources arranged in the y direction of FIG. 7, of the quadrupole illumination shown in FIG. 8 is obtained using the same method. The simulation result of the optical intensity distribution of the quadrupole illumination is obtained by combining the simulation result of the optical intensity distribution of the two light sources in the x direction with the simulation result of the optical intensity distribution of the two light sources in the y direction. The size of the imaged contact hole pattern can be obtained in this way.

According to the embodiment, the same calculation as the thin mask approximate calculation is performed and the phase difference of the semitransparent portion is changed according to the incident angle, thereby making it possible to measure the intensity distribution of the light irradiated on the substrate surface through a mask in a short time in the same way as the thin mask approximate calculation, and more accurately than the thin mask approximate calculation.

Next, after an adjustment to a bias of the mask such as an OPC (optical proximity correction) is performed in order to transfer the contact hole within the range of a desired size, the above-mentioned process is repeated to design a contact hole of the corresponding size on the mask.

Figure 10:
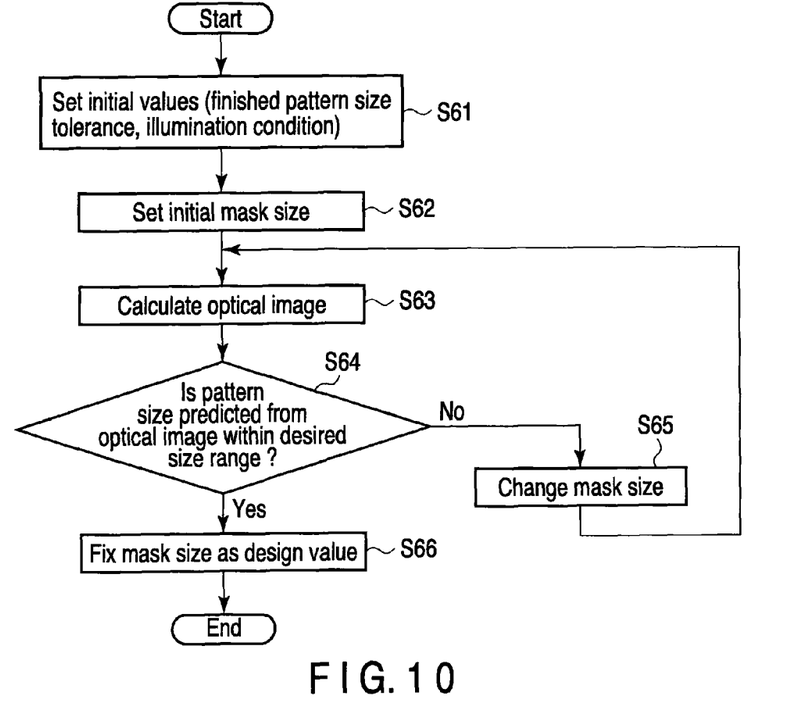
FIG. 10 is a flow chart showing a procedure of deciding a mask design value using a simulation method of the embodiment.

FIG. 10 shows the flow chart at that time. At first, a tolerance on the size of a finished mask pattern and an illumination condition are set as the initial values (Step S61), and according to these values, an initial size of the mask is set (Step S62). The optical image is then calculated through the simulation based on the flow chart shown in FIG. 9 (Step S63). It is checked whether the pattern size estimated from the optical image is within the range of the desired size or not (Step S64). When the estimated pattern size is out of the above range, the mask size is changed (Step S65) and then the processing returns to Step S63, where the optical image calculation is performed again. When the estimated pattern size is in the above range, the mask at that time is fixed as a design value (Step S66).

A desired resist pattern is obtained by imaging the mask made by using the design values of the contact hole pattern on the mask obtained in the above processes, on a light-sensitive film on a substrate with a projection aligner and then developing the light-sensitive film. According to the embodiment, it is possible to reduce the simulation time for a design of a pattern to about $1/10^2$, compared with the case of performing a strict calculation with the oblique incident light angle and the three-dimensional mask structure taken into consideration, and to design the pattern as accurately as the above-mentioned case.

Figure 11:
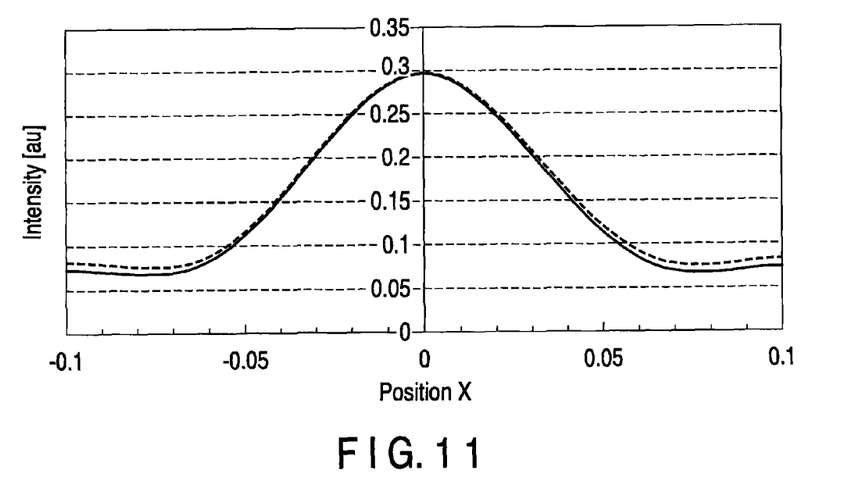
FIG. 11 is a view showing an optical image calculation result according to the simulation method of the embodiment.

FIG. 11 is a view showing an optical image calculation result in this embodiment, in comparison with a strict calculation result. A solid line shows a strict calculation curve and a broken line shows a thin mask approximate calculation curve according to the embodiment. From FIG. 11, it is found that the approximate calculation result according to the embodiment almost in agreement with the result of strict calculation with the oblique incident light angle and the three-dimensional mask structure strictly taken into consideration.

As mentioned above, according to the embodiment, it is possible to perform a simulation of an optical intensity distribution at a high speed with the oblique incidence of the exposure light and the three-dimensional mask effect taken into account, without performing strict calculation of the three-dimensional mask structure. Further, a speedier calculation is possible by using the calculation results stored in the DB. Further, when the phase differences obtained through strict calculation using the three-dimensional mask under various lithography conditions are functionalized, each phase difference is given as a function, hence obtaining an optical image at a higher speed through access to the DB.

Further, a phase difference between the zero-order diffraction light and the first-order diffraction light is shown as a distribution on a map with the pupil of a projection optical system divided into grids, in other words, the phase difference is mapped on the pupil, hence to improve the visibility and simplify the simulation.

Although the example of the pattern size design for a contact hole has been described in the above embodiment, another pattern (for example, L/S, isolated line, isolated space, and isolated hole) can be designed in a short time by using the same method.

Figure 12:
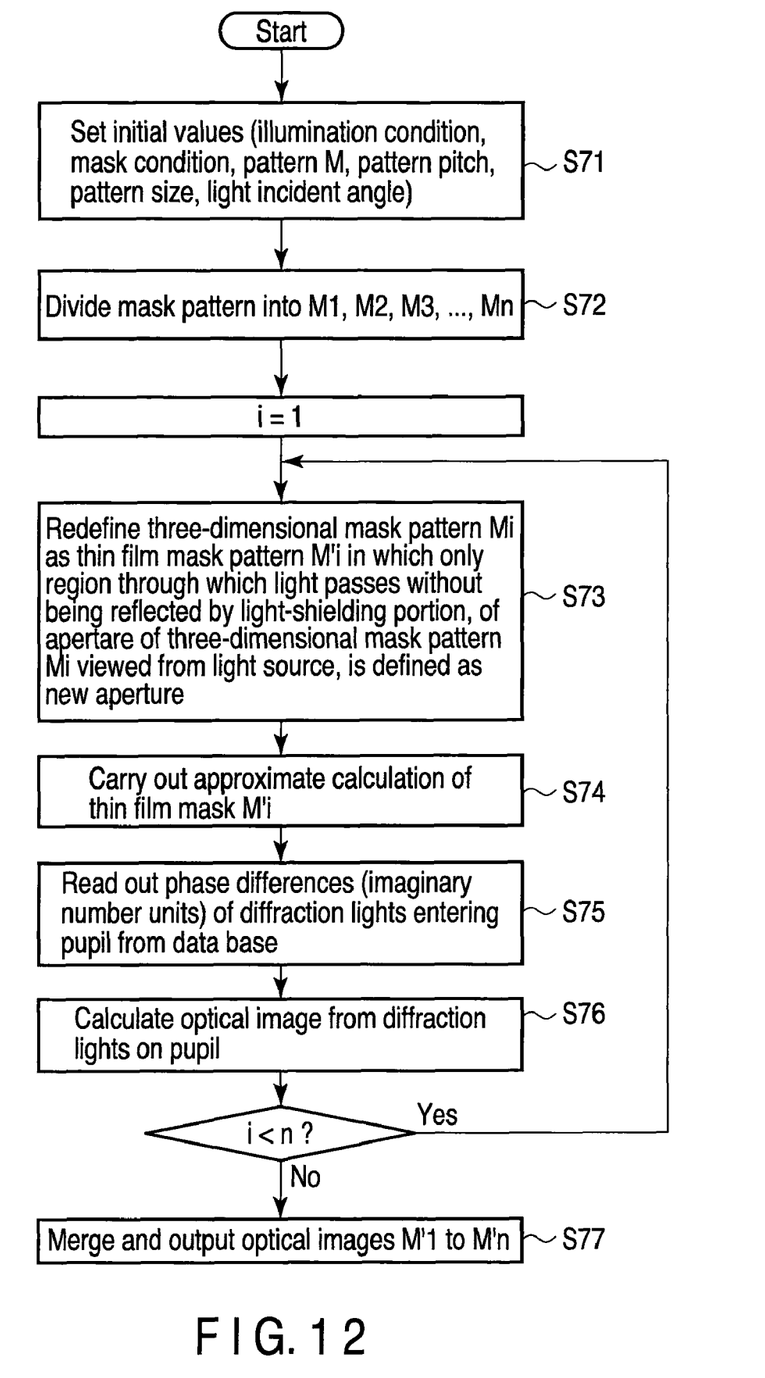
FIG. 12 is a flow chart for use in describing an operation of an optical image calculation unit to a non-periodic pattern that is a modification example of the embodiment.

The flow chart of FIG. 12 shows the calculation of a non-periodic pattern. Specifically, an illumination condition, a mask condition, a pattern type, a pattern pitch, a pattern size, and a light incident angle are set as initial values (Step S71), the pattern M of a calculation area is divided into simple parts M1, M2, M3, . . . and Mn (Step S72), a thin mask is set in each part by using a shadow model (Step S73), and an amplitude of a diffraction light is obtained through the thin mask approximate calculation (Step S74). Then, a phase difference is read out from the data base (Step S75), and a phase of the first-order diffraction light is calculated based on the read phase difference (Step S76). The optical images obtained from the respective parts are merged, to obtain an optical image of the first pattern M (Step S77).

The processing is not limited to the phase of the first-order diffraction light, but, for example, even when the size of the pattern is large and the order of the diffraction light entering the pupil is larger than one, the phase difference corresponding to the above order of the diffraction light may be a target.

When a plurality of patterns are on the same mask, the above-mentioned method can be applied to the design at the same time, in order that all the patterns on the mask can be transferred onto the substrate within the range of the desired size.

Each phase difference between the zero-order diffraction light and the first-order diffraction light is obtained at some points with the intervals on the pupil as the variable, and when a necessary condition is a condition in the medium point of these points, interpolation is performed, hence to obtain an approximate phase difference distribution. In the above-mentioned embodiment, the phase differences under various lithography conditions are calculated in advance, the calculation results are stored or functionalized in the data base (DB), and a necessary phase difference for the simulation mode is read out from the DB, in order to prevent a reduction in the simulation speed. This method, however, takes a considerable amount of time to make the DB.

Hereinafter, a second embodiment will be described. In the second embodiment, a phase difference and an amplitude ratio between the zero-order diffraction light and the first-order diffraction light of the three-dimensional mask corresponding to the thin mask are previously calculated under one lithography condition, and a phase difference and an amplitude ratio between the zero-order diffraction light and the first-order diffraction light of the three-dimensional mask under a lithography condition different from the above one lithography condition are set for the mask used under the different lithography condition, based on the relation obtained through the calculation under the above one lithography condition. As the lithography condition, an bias value which is an area ratio in the periodic pattern (the rate of the aperture in the periodic pattern) is used.

Figure 13:
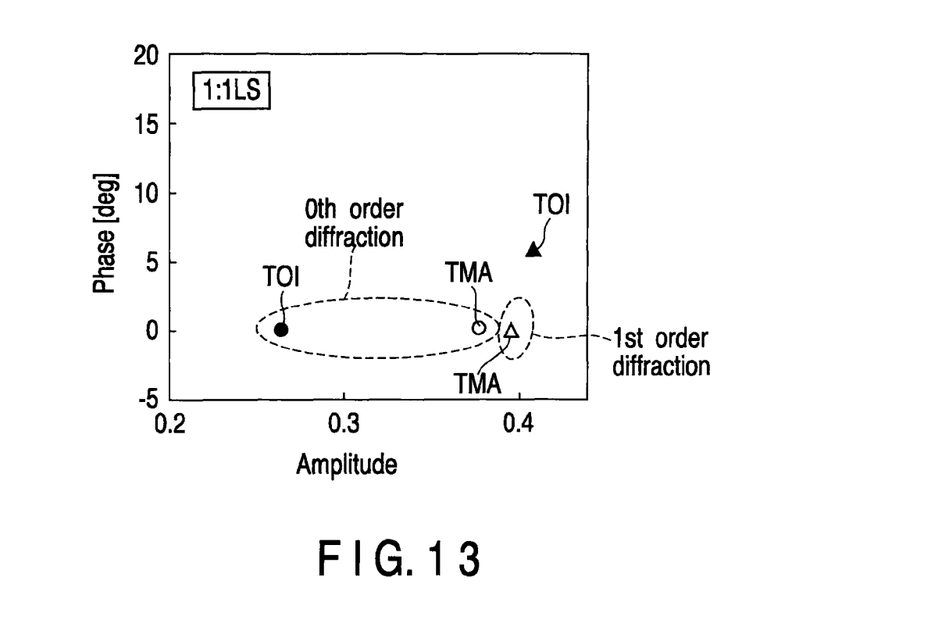
FIG. 13 is a view showing a fluctuation of diffraction light balance due to a mask three-dimensional effect, for use in describing another embodiment of the present invention.

FIG. 13 is a view showing a fluctuation in a diffraction light balance according to the mask three-dimensional effect in the case of using an L/S (line/space) pattern having a one-to-one ratio of pattern width and pattern space width. Contrary to the thin mask (TMA), in the three-dimensional mask (TOI), the amplitude of the zero-order diffraction light changes largely, while the amplitude of the first-order diffraction light does not change so much. Also, in the three-dimensional mask, the phase of the zero-order diffraction light does not change, while the phase of the first-order diffraction light changes slightly. This fluctuation in amplitude and phase is caused by the effect of the waveguide and the oblique incident effect of exposure light.

Figure 14:
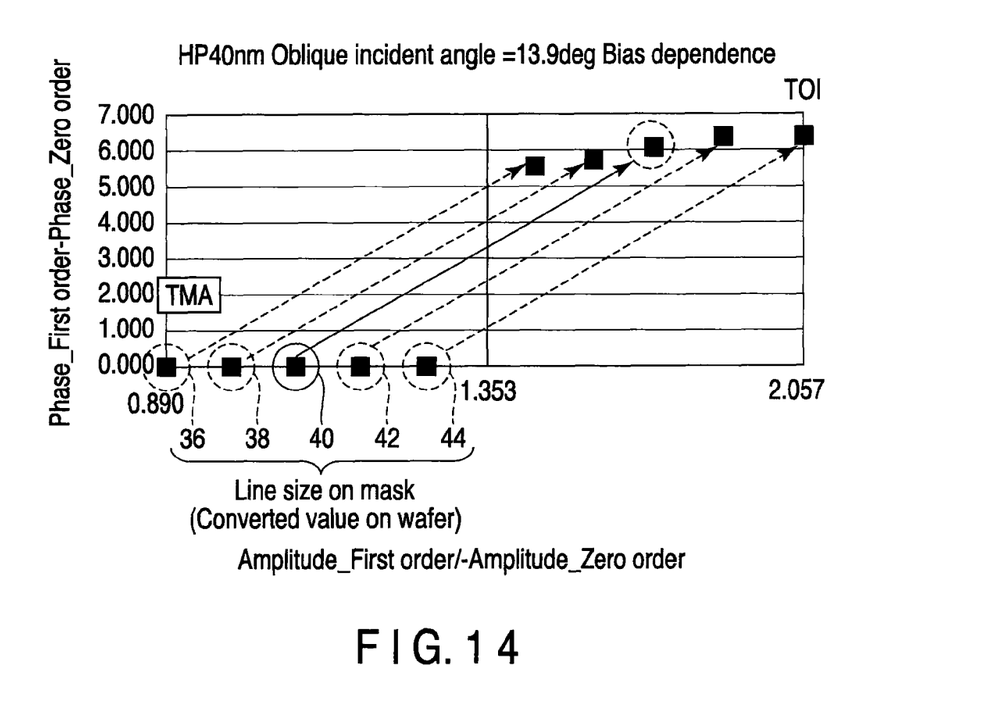
FIG. 14 is a view showing bias dependence of the diffraction light balance due to a mask three-dimensional effect.

FIG. 14 is a view showing the results from calculation of the bias dependence based on the relation shown in FIG. 13. In the calculation results shown in FIG. 14, conditions such as the film thickness and pitch of a pattern other than the bias are fixed. The vertical axis shows the phase difference between the first-order diffraction light and the zero-order diffraction light and the horizontal axis shows the amplitude ratio between the first-order diffraction light and the zero-order diffraction light, in a logarithm scale.

Figure 15A:
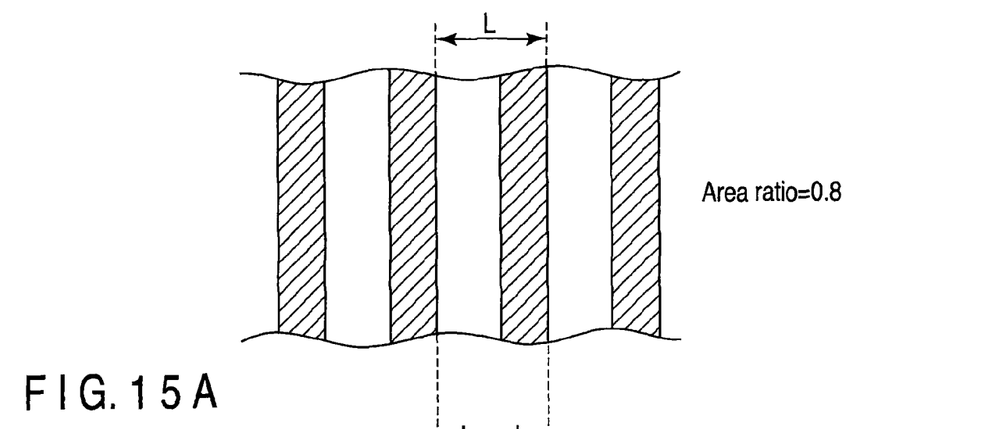
FIG. 15A is a view showing an example of an L/S pattern.
Figure 15B:
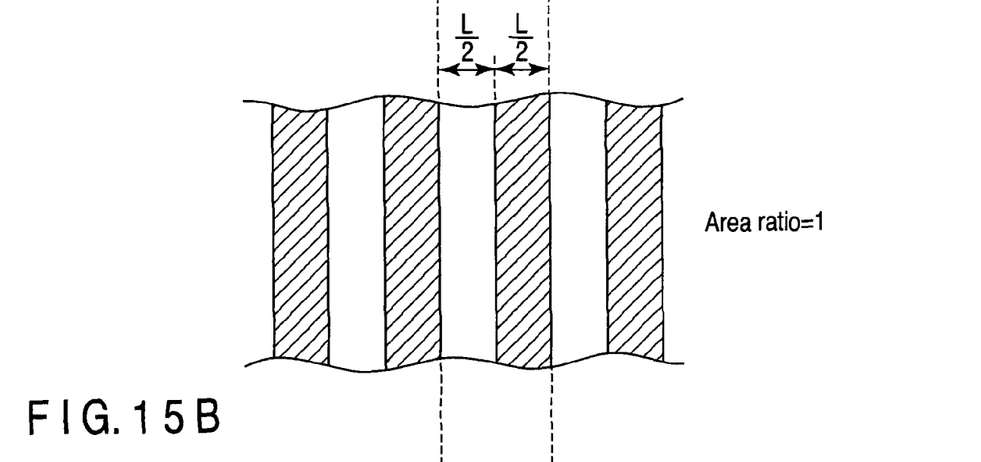
FIG. 15B is a view showing another example of an L/S pattern different from the L/S pattern shown in FIG. 15A in a bias value (area ratio)
Figure 15C:
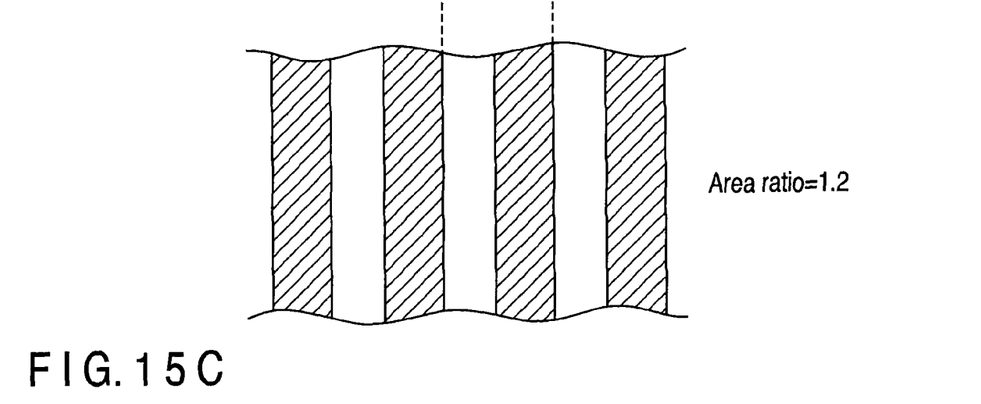
FIG. 15C is a view showing an example of an L/S pattern different from the L/S patterns respectively shown in FIGS. 15A and 15B in a bias value (area ratio).

Every L/S pattern has an L/S pattern having the same pitch L, for example, 80 nm pitch on the mask, and having a different bias as shown in FIGS. 15A, 15B, and 15C. The bias value is the rate of the aperture in the periodic pattern (area ratio), in other words, the ratio between the pattern width and the pattern space width. FIG. 15A shows an L/S pattern having an area ratio of 0.8, FIG. 15B shows an L/S pattern having an area ratio of 1 (1:1), and FIG. 15C shows an L/S pattern having an area ratio of 1.2. In FIG. 14, various bias values according to the line width of the pattern are shown.

As shown in FIG. 14, the three-dimensional mask (TOI) becomes larger in the phase difference and the intensity ratio between the zero-order diffraction light and the first-order diffraction light, compared with the thin mask (TMA). The way the phase difference and the intensity ratio change is very similar among the different bias values, and the straight line, which indicates a change from a thin mask to a three-dimensional mask, is shifted in parallel by the difference of the bias value.

Therefore, even when the bias value is changed, if only there is known a target position for the thin mask approximate calculation corresponding to the changed bias value, it is possible to predict the amplitude ratio and the phase difference of the diffraction light that is the calculation result of the strict calculation with the three-dimensional structure taken into consideration, according to the positional relation on a scatter diagram, by obtaining the positional relation on the scatter diagram about the diffraction light amplitude ratio (first-order diffraction light amplitude/zero-order diffraction light amplitude) and the phase difference (first-order diffraction light phase—zero-order diffraction light phase) on the pupil obtained through the thin mask approximate calculation at a time of approximating the thin mask having the same pitch and line size and the strict calculation with the oblique incidence and the three-dimensional structure of the three-dimensional mask taken into consideration, as shown by the symbol ○ in FIG. 14, without actually performing the strict calculation with the three-dimensional structure taken into consideration.

In other words, when the conditions such as the film thickness and pitch of a pattern are the same, for a pattern having a different bias value, it is possible to easily obtain the amplitude ratio and the phase difference of the three-dimensional mask corresponding to the thin mask, by calculating the positional relation of only one pattern on the scatter diagram in advance.

Specifically, a phase difference and an amplitude ratio between the zero-order diffraction light and the first-order diffraction light is calculated in advance, respectively in the case of using a thin mask having a certain bias value and in the case of using a three-dimensional mask having the same bias value. The amount of shift from the thin mask to the three-dimensional mask on the phase difference between the zero-order diffraction light and the first-order diffraction light and the amplitude ratio between the zero-order diffraction light and the first-order diffraction light is obtained from the calculation result. Assuming that a three-dimensional mask having a predetermined bias value used for the lithography simulation in the embodiment is a thin mask, the phase difference and the amplitude ratio between the zero-order diffraction light and the first-order diffraction light using the assumed thin mask is calculated, and the above calculated shift amount on the phase difference and the amplitude ratio is added to the calculated phase difference and amplitude ratio, hence to set the phase difference and the amplitude ratio of the above three-dimensional mask corresponding to the assumed thin mask. The simulation of the optical intensity distribution on the substrate is performed according to the set phase difference and amplitude ratio, by using a thin mask assumed to be the above thin mask, which enables an accurate simulation. Further, since it is not necessary to perform strict calculation using a three-dimensional mask, it can be performed in almost as short a time as the thin mask approximate calculation. Here, it is not necessary to set the film thickness and the pitch of the three-dimensional mask used for calculating a three-dimensional mask and a shift amount applied to the simulation at constant values. However, when the three-dimensional mask and the shift amount are set at constant values, a more accurate simulation may be performed.

Further, it is not necessary to perform a calculation of the phase difference and the amplitude ratio between the zero-order diffraction light and the first-order diffraction light on a mask having a lot of and a great variety of biases and to make a database in advance, and only a calculation for one bias is sufficient, which makes the preprocessing of preparing for the simulation very simple.

Although the example of the size design about the L/S pattern has been described in the embodiment, the size design regarding the contact hole can be performed in a short time in the same way.

When patterns having various pitches exist on a mask, a phase difference and an amplitude ratio between the zero-order diffraction light and the first-order diffraction light in a three-dimensional mask corresponding to the thin mask may be previously calculated for one bias for every different pitch. Namely, a calculation on one bias will suffice for every different condition other than the bias.

Although the simulation using a mask having a periodic pattern has been performed in the embodiment, it is not always necessary to use the above mask. For example, a shift amount of the phase difference and the amplitude ratio between the zero-order diffraction light and the first-order diffraction light on the pupil of the projection optical system in the transfer process using a thin mask having a predetermined area ratio and a three-dimensional mask having the same area ratio as the thin mask may be obtained, a phase difference and an amplitude ratio between the zero-order diffraction light and the first-order diffraction light on the pupil of the projection optical system in the transfer process using a thin mask having an arbitrary area ratio may be calculated, and based on the phase difference and the amplitude ratio set by adding the calculated phase difference and amplitude ratio to the shift amount, it is possible to perform the simulation of the transfer process using the thin mask having an arbitrary area ratio. Here, the above predetermined area ratio means the ratio of an aperture in a predetermined mask surface region. The above arbitrary area ratio may be the ratio of an aperture in a mask surface region of the same size as the predetermined mask surface region or the ratio of an aperture in a mask surface region of a different size from the predetermined mask surface region.

Although the shift amount of the phase difference and the amplitude ratio between the thin mask approximate calculation and the strict calculation with the three-dimensional mask structure using the oblique incidence taken into consideration has been obtained in the embodiment, it is also possible to provide a step of obtaining a phase difference and amplitude ratio of the diffraction light on the pupil by a vertical light incidence on a mask, between these calculations, strictly taking only the three-dimensional mask structure into consideration. In other words, the shift amount is divided into the shift amount to the phase difference and the amplitude ratio obtained through the calculation with the three-dimensional mask structure taken into consideration through the vertical incident light from the phase difference and the amplitude ratio obtained through the thin mask approximate calculation and the shift amount to the phase difference and the amplitude ratio obtained through the strict calculation with the three-dimensional mask structure taken into consideration using the oblique incident light from the phase difference and the amplitude ratio obtained by the calculation with the three-dimensional mask structure taken into consideration through the vertical incident light, and these shift amounts are sequentially applied, to obtain a phase difference and an amplitude ratio by performing strict calculation with the oblique incident light and the three-dimensional mask structure taken into consideration from the phase difference and the amplitude ratio of the diffraction light via the thin mask approximate calculation.

Therefore, for example, when the mask pattern does not change but the light incident angle changes according to a change of illumination shape, it is only necessary to calculate the shift amount of the phase difference and the amplitude ratio from the calculation with the three-dimensional structure taken into consideration through a vertical incident light to the strict calculation with the three-dimensional structure taken into consideration through an oblique incident light, which makes it easy to analyze the phase difference and the amplitude ratio obtained by the strict calculation with the three-dimensional structure taken into consideration through the oblique incident light.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of simulating an optical intensity distribution on a substrate when a mask pattern formed on a mask is transferred to the substrate through a projection optical system by irradiating an illumination light obliquely on a mask surface of the mask, the method comprising:

setting a phase difference between a zero-order diffraction light and a first-order diffraction light determined according to a function of factors comprising a distance between the zero-order diffraction light and the first-order diffraction light on a pupil of the projection optical system, a thickness of a light-shielding portion formed on the mask, an angle defined by an optical axis direction of the illumination light and an incident direction on the mask, and a difference between a size of the mask pattern and a half cycle of the mask pattern when the mask pattern is a periodic pattern; and carrying out a simulation of the optical intensity distribution on the substrate according to the set phase difference.

2. The simulation method according to claim 1, wherein the simulation of the optical intensity distribution is carried out using a mask with a mask pattern formed by a mask portion through which the illumination light passes without interruption by the light-shielding portion.

3. The simulation method according to claim 1, wherein the phase difference between the zero-order diffraction light and the first-order diffraction light is set by reading out a database which stores calculation results of the function of factors comprising the phase difference between the zero-order diffraction light and the first-order diffraction light on the pupil of the projection optical system, the distance, the thickness, the angle, and the difference at a time of transferring the mask pattern formed on a three-dimensional mask onto the substrate through the projection optical system.

4. The simulation method according to claim 1, wherein the phase difference between the zero-order diffraction light and the first-order diffraction light is shown as a distribution on a map with a pupil of the projection optical system divided into grids.

5. The simulation method according to claim 1, wherein the mask pattern is a pattern selected from the group consisting of an L/S pattern, an isolated line pattern, an isolated space pattern, and an isolated hole pattern.

6. The simulation method according to claim 1, wherein the phase difference between the zero-order diffraction light and the first-order diffraction light is obtained in a plurality of points with an interval on the pupil of the projection optical system as a variable, and when a necessary condition is at a medium point of the points, an approximate phase difference distribution is obtained through interpolation.

7. The simulation method according to claim 1, wherein an illumination source for irradiating the illumination light is a quadrupole, a first simulation is performed with respect to the optical intensity distribution of the illumination light from two exposure light sources arranged in an x direction and a second simulation is performed with respect to the optical intensity distribution of the illumination light from two exposure light sources arranged in a y direction, and the optical intensity distribution on the substrate is simulated by combining the first and second simulations.

8. A non-transitory computer readable medium storing a computer program which causes a computer to perform a method for simulating an optical intensity distribution on a substrate when a mask pattern formed on a mask is transferred onto the substrate through a projection optical system by irradiating an illumination light obliquely on a mask surface of the mask, the method comprising:
  setting a phase difference between a zero-order diffraction light and a first-order diffraction light determined according to a function of factors comprising a distance between the zero-order diffraction light and the first-order diffraction light on a pupil of the projection optical system, thickness of a light-shielding portion formed on the mask, angle defined by an optical axis direction of the illumination light and an incident direction on the mask, and a difference between a size of the mask pattern and a half cycle size of the mask pattern when the mask pattern is a periodic pattern; and
  carrying out a simulation of the optical intensity distribution on the substrate according to the set phase difference.

9. The non-transitory computer readable medium according to claim 8, wherein the setting of the phase difference between the zero-order diffraction light and the first-order diffraction light includes reading out a database which stores calculation result of the function of factors comprising the phase difference between the zero-order diffraction light and the first-order diffraction light on the pupil of the projection optical system, the distance, the thickness, the angle, and the difference at a time of transferring the mask pattern formed on a three-dimensional mask onto the substrate through the projection optical system.

* * * * *